United States Patent
Kim

(10) Patent No.: US 7,271,676 B2
(45) Date of Patent: Sep. 18, 2007

(54) METHOD AND/OR APPARATUS FOR IMPLEMENTING A VOLTAGE CONTROLLED RING OSCILLATOR HAVING A MULTI-PEAK DETECTED AMPLITUDE CONTROL LOOP

(75) Inventor: Heung S. Kim, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 10 days.

(21) Appl. No.: 11/256,696

(22) Filed: Oct. 24, 2005

(65) Prior Publication Data

US 2007/0090888 A1    Apr. 26, 2007

(51) Int. Cl.
*H03B 5/00* (2006.01)
(52) U.S. Cl. .......................... 331/183; 331/57
(58) Field of Classification Search .............. 331/182, 331/183, 57
See application file for complete search history.

(56) References Cited

U.S. PATENT DOCUMENTS

| | | | | |
|---|---|---|---|---|
| 4,603,288 | A | * | 7/1986 | Rogers ................. 323/234 |
| 5,821,821 | A | * | 10/1998 | Ahdab et al. ............ 331/57 |
| 6,614,318 | B1 | * | 9/2003 | Boecker ................. 331/17 |
| 6,653,908 | B1 | * | 11/2003 | Jones ................... 331/183 |

OTHER PUBLICATIONS

Ian A. Young, et al., "A PLL Clock Generator with 5 to 110 MHz of Lock Range for Microprocesors", IEEE Journal of Solid-State Circuits, vol. 27, No. 11, Nov. 1992, pp. 1599-1607.
Mihai A. Margarit et al., "A Low-Noise, Low-Power VCO with Automatic Amplitude Control for Wireless Applications", IEEE Journal of Solid-State Circuits, vol. 34, No. 6, Jun. 1999, pp. 761-771.
John G. Maneatis, "Low-Jitter Process-Independent DLL and PLL Based on Self-Biased Techniques", IEEE Journal of Solid-State Circuits, vol. 31, No. 11, Nov. 1996, pp. 1723-1732.
John G. Maneatis et al., "Precise Delay Generation Using Coupled Oscillators", IEEE Journal of Solid State Circuits, vol. 28, No. 12, Dec. 1993, pp. 1273-1282.

* cited by examiner

*Primary Examiner*—Joseph Chang
(74) *Attorney, Agent, or Firm*—Christopher P. Maiorana, P.C.

(57) ABSTRACT

An apparatus comprising a first circuit and a second circuit. The first circuit may be configured to generate an output signal oscillating at a first frequency in response to (i) a first control signal, and (ii) a second control signal. The second circuit may be configured to generate the second control signal in response to (i) an input signal having a voltage and (ii) the output signal. The second circuit may be configured to compare a peak voltage of the output signal to the input voltage.

17 Claims, 5 Drawing Sheets

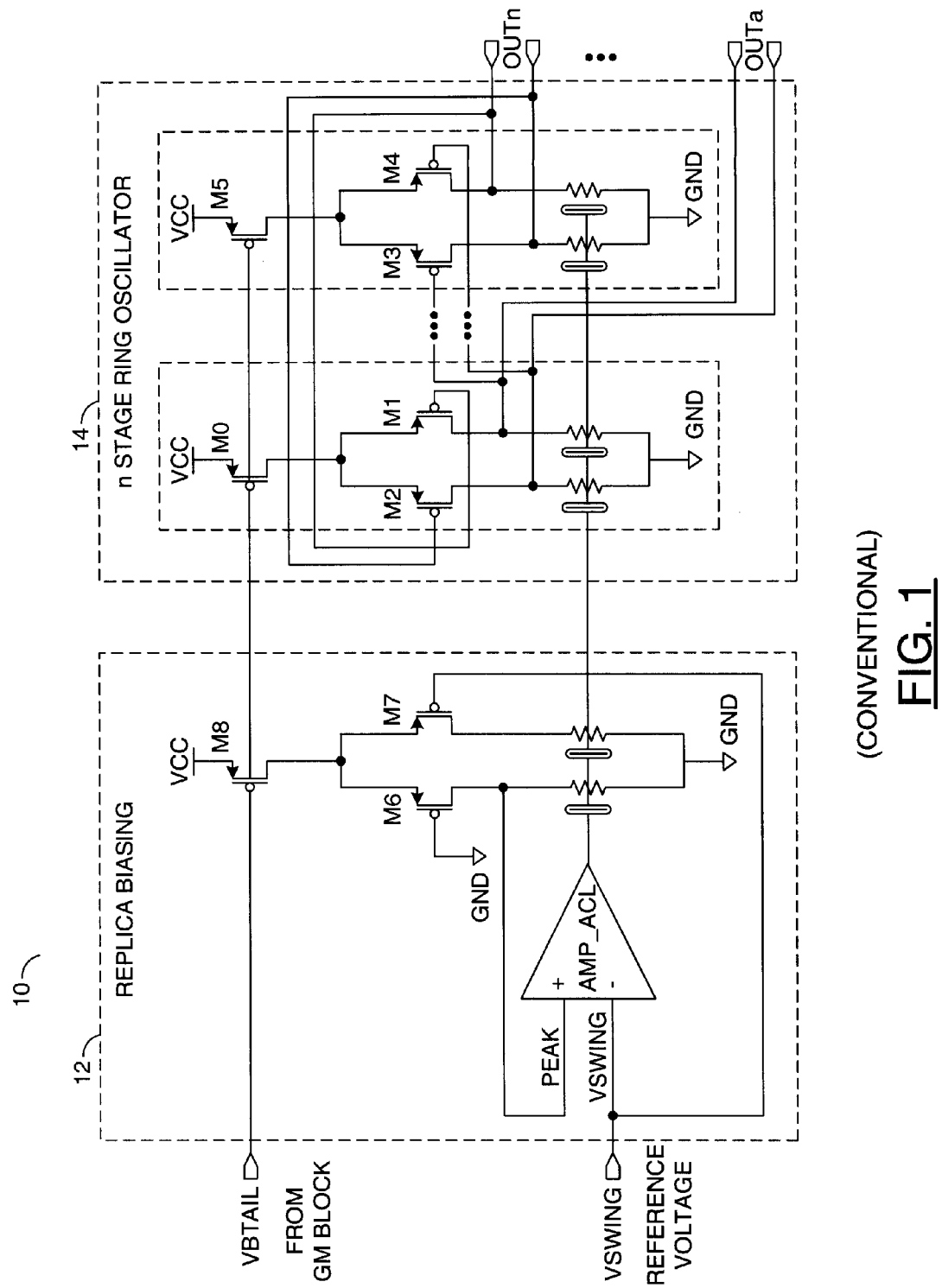
FIG. 1
(CONVENTIONAL)

METHOD AND/OR APPARATUS FOR IMPLEMENTING A VOLTAGE CONTROLLED RING OSCILLATOR HAVING A MULTI-PEAK DETECTED AMPLITUDE CONTROL LOOP

FIELD OF THE INVENTION

The present invention relates to oscillators generally and, more particularly, to a method and/or apparatus for implementing a voltage controlled ring oscillator having a multi-peak detected amplitude control loop.

BACKGROUND OF THE INVENTION

Conventional DVD and CD servo applications use a wide range clock frequencies to accommodate various media sizes and various speeds of operation. If a servo and RF path need to cover speeds ranging from a 4× CD to a 5× DVD, appropriate clock frequencies need a range from 15 Mhz to 135 Mhz. Such a clock also needs to keep a reasonably low and constant Kvco coefficient (i.e., Kvco=100%*Fvco) for appropriate noise immunity and timing loop bandwidth control. Conventional approaches have many difficulties implementing such a wide frequency range oscillator using CMOS technology due to the low Gm of the MOS transistor.

One conventional CMOS ring oscillator is disclosed by John Meneatis and Mark A. Horowitz in the December 1993 JSSC. Such an approach has been widely used for a CMOS Voltage Controlled Oscillators. Such a CMOS ring oscillator experiences obstacles when trying to provide a wide frequency range along with a low Kvco coefficient (Kvco=delta Fvco/delta Vc; Vc=voltage input to the VCO). The current of the ring oscillator delay cell needs to be increased in square relation to the oscillation frequency. In particular, Fvco=sqrt (2*k*Id)/Cload, where k=constant, and Id=current on the delay cell. The reason for the square relationship (i.e., the frequency Fvco does not increase linearly with the current) is that the voltage swing amplitude on the delay cell load made by a CMOS transistor is enlarged as the current Id becomes larger for a higher frequency operation, where Fvco=Id/(Cload*Voltage Swing). In order to get a 10× frequency range on the VCO, the current on the delay cell needs to be extended about 100 times with a same control voltage at the VCO input. Such a 100 times current range is not practical for a CMOS analog design. Even if such a design was possible, such a design would consume a large amount power when operating at a high frequencies.

For a wide frequency range application, another conventional approach for implementing a CMOS VCO has been disclosed by Ian A. Young in November 1992 JSSC. Such a VCO system 10 is shown in FIG. 1. Such a CMOS VCO has a problem as the frequency of oscillation increases. In such a system, the control voltage (i.e., the input of the VCO) is converted to a current for delay cells in the replica cell. A Voltage Controlled Resistor (VCR) load in the replica cell 12 can only match the resistor value in the delay cell, since the replica cell 12 is working in a static (or DC) operation. When the VCO 12 is generating a frequency for oscillation, the system 10 is not operating in a DC mode. In the real operation of the VCO 10, all of the capacitors on the output of the oscillator delay cell start to contribute for the output impedance. In the static DC replica cell, a bias current is generated with a resistor value that excludes the capacitors loading. The amplitude swing of delay cells is different (smaller) than the intended swing in the replica cell. The difference will be exaggerated with process corner variations. In particular, the frequency targeted with a certain input control voltage will have a wide variation from chip to chip or wafer to wafer. Also, the system 10 will not have a constant value Kvco because of a non-linearity of the parasitic capacitance on the output of the delay cell.

Another conventional VCO has been introduced by Mihai A. Margarit et al. in June 1999 JSSC. An LC tank (inductor and capacitor tank) oscillator is disclosed. In this architecture, the frequency of the LC oscillator is controlled by a value of a capacitor. The value of the capacitor can be changed by a varactor diode with a control voltage or by switching a number of capacitors on the LC resonator. In general, an integrated LC resonator is difficult to get a wide frequency range and a low frequency of oscillation. Such a system has difficulty being used in CD or DVD application. In such an architecture, an automatic amplitude control loop (CAAC) controls a current Itail to maintain a certain oscillation swing amplitude. The AAC circuit is not using a voltage controlled resistor (VCR) to a load resistance value (which is used in Ian Young's ring oscillator and in this invention). The current ITAIL is different depending on the parasitic resistance on the LC tank. The power consumption of the VCO has a variation depending on the parasitic parameter.

SUMMARY OF THE INVENTION

The present invention concerns an apparatus comprising a first circuit and a second circuit. The first circuit may be configured to generate an output signal oscillating at a first frequency in response to (i) a first control signal, and (ii) a second control signal. The second circuit may be configured to generate the second control signal in response to (i) an input signal having a voltage and (ii) the output signal. The second circuit may be configured to compare a peak voltage of the output signal to the input voltage.

The objects, features and advantages of the present invention include providing a method and/or apparatus for implementing a voltage controlled ring oscillator that may (i) provide a wide frequency range, (ii) use a peak detection amplitude control loop, (iii) provide a better linear and stable control to frequency relationship, (iv) use multiple peak detection in an amplitude control loop, (v) provide a linear relationship between an oscillation frequency and an input voltage over a wide frequency range, (vi) be implemented with a small capacitor in the peak detector by using a multiple peak detection circuit, and/or (vii) be implemented with a lower KVCO value and a wide oscillation range.

BRIEF DESCRIPTION OF THE DRAWINGS

These and other objects, features and advantages of the present invention will be apparent from the following detailed description and the appended claims and drawings in which:

FIG. 1 is a block diagram of a conventional ring oscillator;

DETAILED DESCRIPTION OF THE PREFERRED EMBODIMENTS

Figure 2:
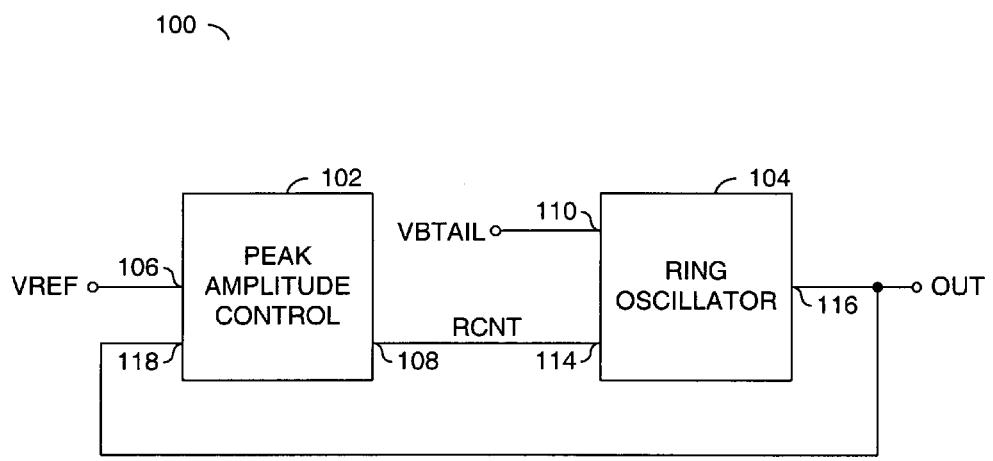
FIG. 2 is a block diagram of the present invention.

Referring to FIG. 2, a block diagram of a system 100 is shown in accordance with a preferred embodiment of the present invention. The system 100 may be implemented as an oscillator. In particular, the system 100 may be implemented as a, voltage controlled ring oscillator having a multi-peak detected amplitude control loop. The system 100 generally comprises a first circuit 102 and a second circuit 104. The first circuit 102 may be implemented as a peak amplitude control circuit. The second circuit may be implemented as a ring oscillator circuit. The circuit 102 may have an input 106 that may receive a signal (e.g., VREF) and an output 108 that may present a signal (e.g., RCNT). The circuit 104 may have an input 110 that may receive a signal (e.g., VBTAIL), an input 114 that may receive the signal RCNT and an output 116 that may present a signal (e.g., OUT). The signal OUT may also be presented to an input 118 of the circuit 102. The signal OUT may be an output signal that may oscillate at a second frequency. In one example, the signal IN may be a differential input signal. However, a single ended signal may be implemented in certain applications. In one example, the signal OUT may be a differential output signal. However, a single ended signal may be implemented in certain applications.

Figure 3:
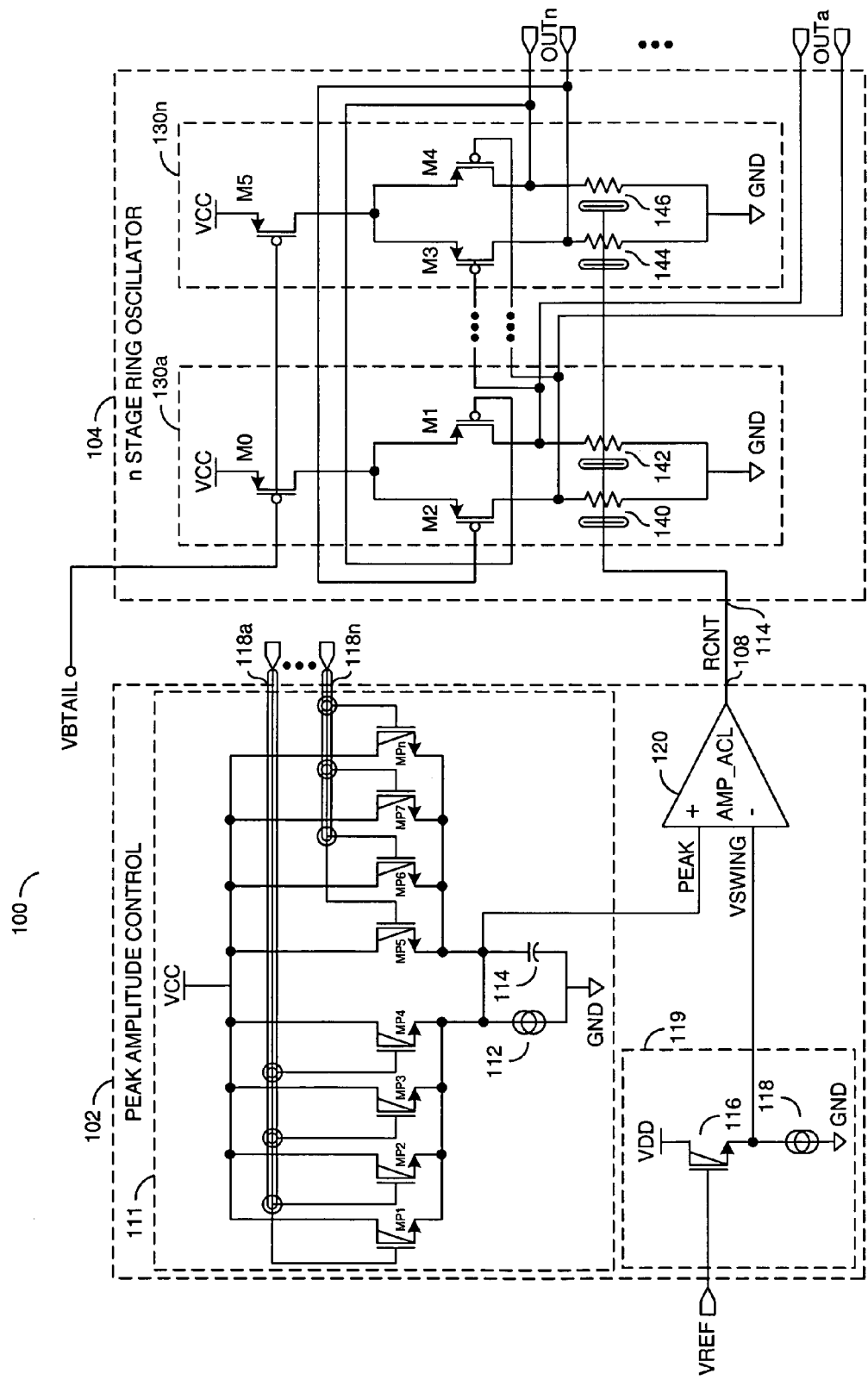
FIG. 3 is a more detailed diagram of the present invention.

Referring to FIG. 3, a more detailed diagram of the circuit 100 is shown. The circuit 102 generally comprises a plurality of transistors MP1-MPn, a current source 112, a capacitor 114, a transistor 116, a current source 118 and a comparator circuit 120. The transistors MP1-MPn, along with the current source 112 and the capacitor 114, may comprise a peak detection circuit 111. While eight transistors MP1-MPn are shown, the particular number of transistors MP1-MPn may be varied to meet the design criteria of a particular implementation. In one example, the transistors MP1-MPn may be implemented as native devices. A native device may be implemented as a device with a threshold voltage of near 0 volts. Native devices are sometimes referred to as non-doped devices. However, the particular type of transistor used to implement the transistors MP1-MPn may be varied to meet the design criteria of a particular implementation. The transistor 116 and the current source 118 may implement a level shifter circuit 119. The circuit 102 shows a number of inputs 118a-118n that are configured to receive the output signals OUTa-OUTn from the circuit 104. The transistor 116 may pass a signal (e.g., VSWING) to a negative input of the comparator 120. The signal VSWING may be a level shifted version (e.g., through the circuit 111) of the signal VREF. The level shifting may match the level shift of the transistors MP1-MPn. The comparator 120 may be implemented as an operational amplifier or other type of comparison circuit.

The circuit 104 generally comprises a number of stages 130a-130n. Each of the stages 130a-130n may be implemented as a delay cell. Each of the stages 130a-130n may receive an input signal from the output of the previous stage. Each of the stages 130a-130n present an output signal OUTa-OUTn. In particular, the stage 130a presents an output signal OUTa, while the stage 130n presents the output signal OUTn. Each of the output signals OUTa-OUTn may be single ended or differential. The particular number of stages 130a-130n may be varied to meet the design criteria of a particular implementation. The stage 130a generally comprises a transistor M0, a transistor M1, a transistor M2, a voltage controlled resistor 140, and a voltage controlled resistor 142. The stage 130n generally comprises a transistor M3, a transistor M4, a transistor M5, a voltage controlled resistor 144, and a voltage controlled resistor 146. The voltage controlled resistors 140, 142, 144 and 146 each receive the control signal RCNT. Each additional stage (e.g., 130a+1 through 130n-1) may be implemented with similar components and connections.

In order to resolve swing amplitude variation issues as the frequency of oscillation of the signals OUTa-OUTn increases, the peak amplitude control block 102 may be implemented. Real swing amplitudes of each of the delay cells 130a-130n are normally detected and compared with the reference level VSWING. The peak amplitude control circuit 102 may be used to detect the highest level of the output signals OUTa-OUTn as detected by the peak detection circuit 111. The peak amplitude control circuit 102 may control the signal amplitudes of the delay cells 130a-130n by changing a resistance value of the voltage controlled resistors 140, 142, 144 and 146.

If the signal PEAK presented the positive input of the comparator 120 is larger than the signal VSWING, the control voltage RCNT is normally adjusted higher to reduce the resistance value of the voltage controlled resistors 140, 142, 144 and 146. The output swing amplitude becomes smaller (e.g., the peak swing amplitude is approximately equal to a current Id of the transistor M0*resistance value of the voltage controlled resistors 140, 142, 144 and 146), and the signal PEAK is reduced. The signal PEAK is normally a voltage that may be controlled by a reference level which is applied to the input of the comparator 120. For example, if a voltage Vo (e.g., delay cell output voltage)—the threshold voltage Vt of the transistors MP1-MPn is larger than the voltage in the capacitor 114, then the peak detection circuit 111 will charge the capacitor 114. If the voltage on the capacitor 114 is higher than the voltage Vo-Vt, then the capacitor 114 will be discharged by the current source 112. The voltage detected by the peak detection 111 will be same as the reference voltage VSWING by the amplitude control loop comprising the comparator 120, the voltage controlled resistors 130a-130n, a peak detect transistors 111, and the peak detect capacitor 114.

In general, each of the outputs OUTa-OUTn are presented to the peak detection block 111. By processing each of the outputs OUTa-OUTn, potential ripple offset on the signal PEAK will be minimized. The number of peaks during a period of an oscillated frequency will be 2 for a differential output since the number of peaks equal the differential output n, the number of delay cell stages. For example, if a 4 stage differential ring oscillator is generating a 100 Mhz clock, the frequency of the peak point will be 800 Mhz. Because of this higher peak detection frequency, the voltage held on the signal PEAK will be updated more frequently. The size of the capacitor 114 needed to hold a level on the signal PEAK may be smaller and the ripple (variation of the detected level) will be smaller.

The frequency of the oscillation of the ring oscillator 104 may be defined as:

Fvco=(alpha)*(Id of M0 . . . or M5)/(VSWING)*(C at the output of the delay cell such as 130a)

where Id of M0 is decided by the signal VBTAIL and the size of the transistor M0

Id (M0)=Id(M5), which means all delay cells run with a same current Id where the signal VSWING is controlled by the ACL (Amplitude Control Loop)

where C is decided by the capacitances of the M1, M2 in 130a and a capacitance of the VCR or an additional Capacitor could be added.

alpha is a constant

The signal VBTAIL controls the frequency of oscillation of the signals OUTa-OUTn.

The ring oscillator 104 is shown implemented with PMOS transistors M0, M1, M2, M3, M4 and M5. However, the ring oscillator 104 may be implemented with other types of transistors. For example, the transistors M0, M1, M2, M3, M4 and M5 may be implemented with NMOS transistors. In such an implementation, the voltage control resistors 140, 142, 144 and 146 may be tied to the supply voltage VCC. In such an implementation, the peak detection circuit 111 may detect the lowest voltage to sense the swing amplitude from the supply voltage VCC to the lowest voltage. In such an implementation, the transistors MP1-MPn may also be implemented as PMOS transistors. The current source 112 and the capacitor 114 may be tied to the supply voltage VCC. In general, the particular polarities of the various transistors and the various signals may be adjusted (e.g., reversed) to meet the design criteria of a particular implementation.

Figure 4A:
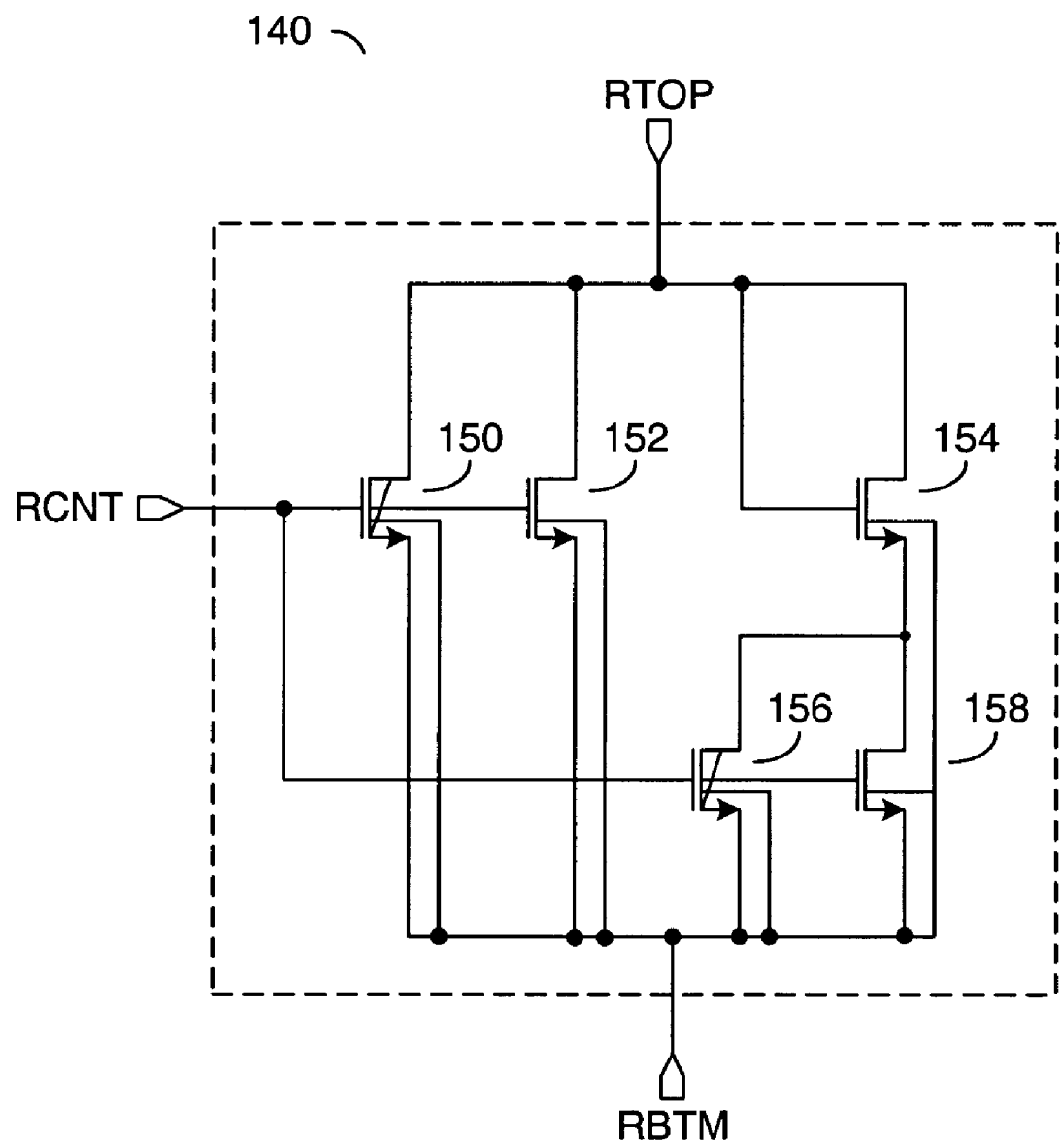
FIG. 4A and FIG. 4B are example implementations of a voltage controlled resistor.
Figure 4B:
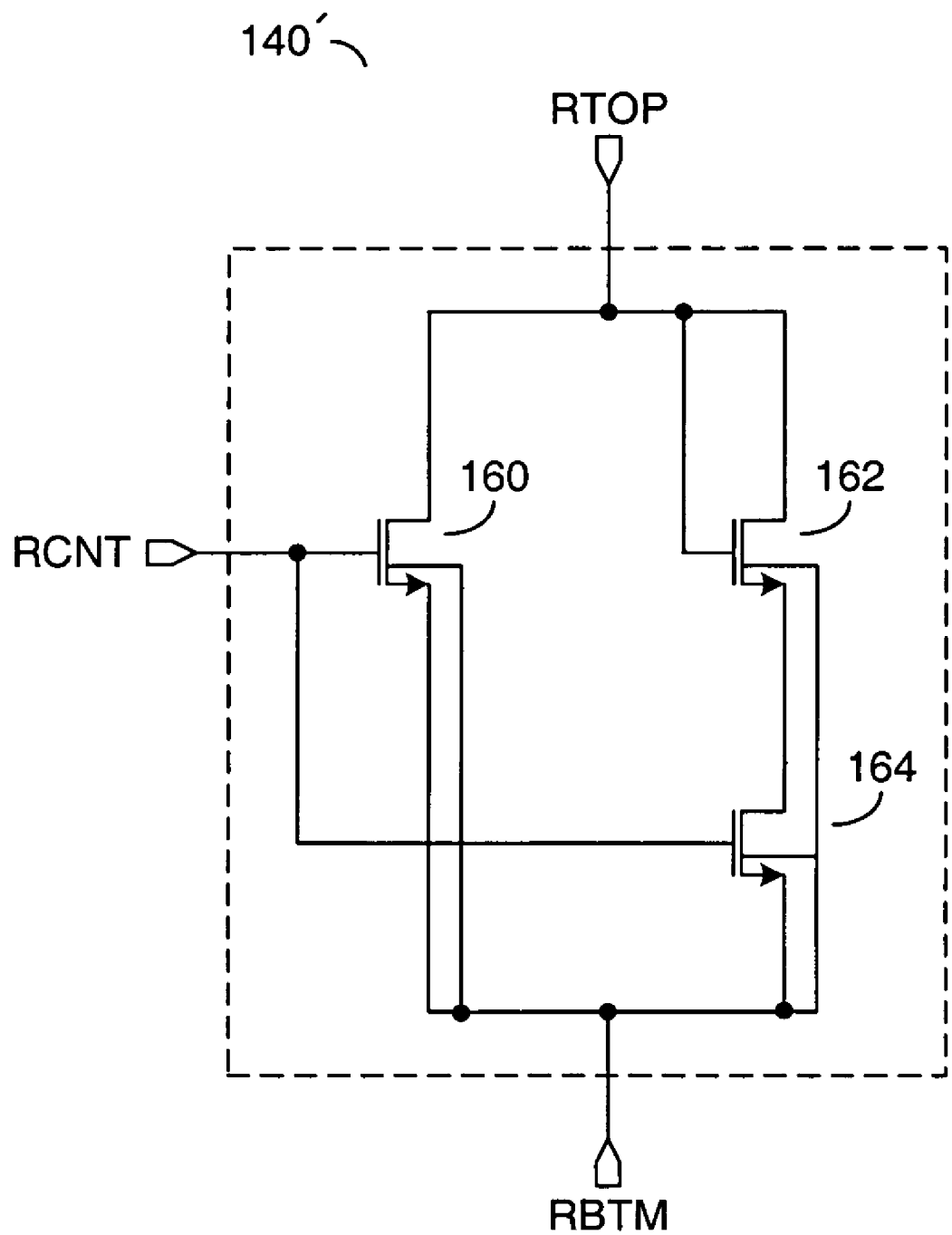

Referring to FIGS. 4A and 4B, an example implementation of a voltage controlled resistor 140 and 140' is shown. FIG. 4A, the voltage controlled resistor 140 generally comprises a transistor 150, a transistor 152, a transistor 154, a transistor 156 and a transistor 158. In the example shown, the transistor 150 and the transistor 156 may be implemented as native devices. The voltage controlled resistor 140' of FIG. 4B generally comprises a transistor 160, a transistor 162 and a transistor 164.

While the invention has been particularly shown and described with reference to the preferred embodiments thereof, it will be understood by those skilled in the art that various changes in form and details may be made without departing from the spirit and scope of the invention. For example, while a multi-stage peak detection circuit 111 has been described, a single stage peak detection circuit may be used.

The invention claimed is:

1. An apparatus comprising:
  a first circuit configured to generate an output signal oscillating at a first frequency in response to (i) a first control signal, and (ii) a second control signal; and
  a second circuit configured to generate said second control signal in response to (i) an input voltage and (ii) said output signal, wherein said second circuit compares a peak voltage of said output signal to said input voltage, wherein said apparatus comprises a voltage controlled ring oscillator having a multi-peak detected amplitude control loop.

2. The apparatus according to claim 1, wherein said first circuit comprises a ring oscillator circuit.

3. The apparatus according to claim 2, wherein said ring oscillator circuit comprises a plurality of stages each having an output signal.

4. The apparatus according to claim 1, wherein said second circuit detects a highest voltage of each of said output signals to compare with said input voltage.

5. The apparatus according to claim 1, wherein said output signal comprises a differential signal.

6. The apparatus according to claim 1, wherein said second circuit comprises an amplitude control loop comprising (i) a peak level detection circuit, (ii) a compare circuit and (iii) one or more voltage control resistors.

7. The apparatus according to claim 3, wherein said output signal of each of said stages is used by said second circuit to generate said second control signal.

8. The apparatus according to claim 1, wherein said input voltage comprises a reference voltage.

9. The apparatus according to claim 1, wherein said first circuit is implemented using a plurality of PMOS transistors and said second circuit is implemented using a plurality of NMOS transistors.

10. The apparatus according to claim 1, wherein said first circuit is implemented with a plurality of NMOS transistors and said second circuit is implemented with a plurality of PMOS transistors.

11. An apparatus comprising:
  means for generating an output signal oscillating at a first frequency in response to (i) a first control signal, and (ii) a second control signal, wherein said means for generating said signal comprises a ring oscillator comprising a plurality of stages each having an output signal; and
  means for generating said second control signal in response to (i) an input voltage and (ii) said output signal, wherein said means for generating said second control signal compares a peak voltage of said output signal to said input voltage, wherein said output signal of each of said stages is used by said means for generating said second control signal to generate said second control signal.

12. A method for implementing a voltage controlled oscillator, comprising the steps of:
  (A) generating an output signal oscillating at a first frequency in response to (i) a first control signal, and (ii) a second control signal, wherein step (A) is implemented in a ring oscillator comprising a plurality of stages each having an output signal; and
  (B) generating said second control signal in response to (i) an input voltage and (ii) said output signal, wherein step (B) compares a peak voltage of said output signal to said input voltage, wherein said output signal of each of said stages is used by step (B) to generate said second control signal.

13. The method according to claim 12, wherein step (B) detects a highest voltage of each of said output signals to said input voltage.

14. The method according to claim 12, wherein said output signal comprises a differential signal.

15. The method according to claim 12, wherein step (B) is implemented using a peak level detection circuit and a compare circuit.

16. The method according to claim 12, wherein said input voltage comprises a reference voltage.

17. An apparatus comprising:
  a ring oscillator circuit (i) comprising a plurality of stages each having an output signal and (ii) configured to generate an output signal oscillating at a first frequency in response to (i) a first control signal, and (ii) a second control signal; and
  a second circuit configured to generate said second control signal in response to (i) an input voltage and (ii) said output signal, wherein said second circuit compares a peak voltage of said output signal to said input voltage, wherein said output signal of each of said stages is used by said second circuit to generate said second control signal.

* * * * *